(12) United States Patent
Li

(10) Patent No.: US 12,424,847 B2
(45) Date of Patent: Sep. 23, 2025

(54) ELECTROSTATIC PROTECTION CIRCUIT, MEMORY DEVICE, MEMORY SYSTEM, AND ELECTROSTATIC PROTECTION METHOD

(71) Applicant: YANGTZE MEMORY TECHNOLOGIES CO., LTD., Wuhan (CN)

(72) Inventor: Zhiguo Li, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 174 days.

(21) Appl. No.: 18/219,631

(22) Filed: Jul. 7, 2023

(65) Prior Publication Data
US 2024/0332959 A1    Oct. 3, 2024

(30) Foreign Application Priority Data
Mar. 28, 2023   (CN) .......................... 202310339443.2

(51) Int. Cl.
*H02H 9/04*     (2006.01)
*G11C 7/24*     (2006.01)
(Continued)

(52) U.S. Cl.
CPC .............. *H02H 9/046* (2013.01); *G11C 7/24* (2013.01); *G11C 16/0483* (2013.01); *G11C 16/30* (2013.01)

(58) Field of Classification Search
CPC ...... H02H 9/046; G11C 7/24; G11C 16/0483; G11C 16/30
(Continued)

(56) References Cited

U.S. PATENT DOCUMENTS 4,347,447 A * 8/1982 Proebsting ....... H03K 19/09443
327/108
8,969,914 B2 * 3/2015 Chalamala ........... H10D 89/819
361/111
(Continued)

FOREIGN PATENT DOCUMENTS

CN           118074495 A  *  5/2024
CN           118739220 A  *  10/2024
WO    WO-2023279486 A1 *  1/2023  ......... H01L 27/0255

*Primary Examiner* — Dharti H Patel
(74) *Attorney, Agent, or Firm* — BAYES PLLC

(57) ABSTRACT

A circuit for electrostatic protection includes a turning-on circuit, a turning-off circuit, and a discharge transistor. The turning-on circuit is coupled to an electrostatic terminal and configured to generate a first control signal based on an electrostatic signal generated by the electrostatic terminal. The turning-off circuit is coupled to the turning-on circuit and configured to generate a second control signal based on the first control signal. The discharge transistor includes a control terminal, a first terminal, and a second terminal. The control terminal is coupled to both the turning-on circuit and the turning-off circuit. The first terminal is coupled to a low voltage terminal. The second terminal is coupled to the electrostatic terminal. The discharge transistor is configured to receive the first control signal at a first time, receive the second control signal at a second time, and perform electrostatic discharging between the first time the second and time.

20 Claims, 10 Drawing Sheets

(51) Int. Cl.
*G11C 16/04* (2006.01)
*G11C 16/30* (2006.01)

(58) Field of Classification Search
USPC .......................................................... 361/56
See application file for complete search history.

(56) References Cited

U.S. PATENT DOCUMENTS

| | | | | |
|---|---|---|---|---|
| 12,088,091 | B2* | 9/2024 | Zhu | H02H 1/0007 |
| 2009/0040671 | A1* | 2/2009 | Zhang | H02H 9/046 |
| | | | | 361/56 |
| 2013/0077195 | A1* | 3/2013 | Stockinger | H02H 9/046 |
| | | | | 361/56 |
| 2014/0211349 | A1* | 7/2014 | Braun | H02H 9/046 |
| | | | | 361/56 |
| 2015/0214732 | A1* | 7/2015 | Haruki | H02H 9/042 |
| | | | | 361/56 |
| 2015/0229125 | A1* | 8/2015 | Kato | H02H 9/046 |
| | | | | 361/56 |
| 2015/0249334 | A1* | 9/2015 | Chen | H02H 9/046 |
| | | | | 361/56 |
| 2022/0052521 | A1* | 2/2022 | Yoon | H02H 1/0007 |
| 2023/0007947 | A1* | 1/2023 | Zhu | H02H 9/046 |
| 2023/0327430 | A1* | 10/2023 | Xue | H02H 1/0007 |
| 2023/0411383 | A1* | 12/2023 | Xu | H10D 89/819 |
| 2024/0061455 | A1* | 2/2024 | Huang | G05F 1/571 |
| 2024/0222965 | A1* | 7/2024 | Huang | H02H 9/046 |

\* cited by examiner

ELECTROSTATIC PROTECTION CIRCUIT, MEMORY DEVICE, MEMORY SYSTEM, AND ELECTROSTATIC PROTECTION METHOD

CROSS-REFERENCE TO RELATED APPLICATIONS

This application claims the benefit of priority to Chinese Application No. 202310339443.2, filed on Mar. 28, 2023, which is incorporated herein by reference in its entirety.

FIELD

The present disclosure relates to the technology field of semiconductors, and in particular to electrostatic protection circuits, memory devices, memory systems, and electrostatic protection methods.

BACKGROUND

With the increasing development of semiconductor chip manufacturing process and the increasing improvement of integration of the circuit, the voltage endurance capability of electronic components is reduced accordingly, and the damage of electrostatic discharge (ESD) to chips is becoming more and more significant. Therefore, it is required to perform electrostatic protection on the chip, and a common method is to set an electrostatic protection circuit in the chip.

SUMMARY

The present disclosure provides an electrostatic protection circuit, a memory device, a memory system, and a method of electrostatic protection.

In the first aspect, an implementation of the present disclosure provides an electrostatic protection circuit, including a turning-on circuit, a turning-off circuit and a discharge transistor.

In some implementations, the turning-on circuit may be coupled to an electrostatic terminal and configured to generate a first control signal based on an electrostatic signal generated by the electrostatic terminal.

In some implementations, the turning-off circuit may be coupled to the turning-on circuit and configured to generate a second control signal based on the first control signal.

In some implementations, a control terminal of the discharge transistor is coupled to both the turning-on circuit and the turning-off circuit, a first terminal of the discharge transistor is coupled to a low voltage terminal, and a second terminal of the discharge transistor is coupled to the electrostatic terminal. In some implementations, the discharge transistor may be configured to receive the first control signal at a first time, receive the second control signal at a second time, and perform electrostatic discharging between the first time and the second time.

In some implementations, the turning-on circuit may include a trigger circuit, coupled to the electrostatic terminal and configured to generate a trigger signal based on the electrostatic signal. In some implementations, the turning-on circuit may include a first processing circuit, coupled to the trigger circuit and configured to generate the first control signal based on the trigger signal.

In some implementations, the turning-off circuit may include a coupling circuit coupled to the first processing circuit and configured to generate a first coupling signal and a second coupling signal based on the first control signal. In some implementations, the time interval between the second time and the first time may be greater than or equal to the time interval between the first coupling signal and the second coupling signal. In some implementations, the turning-off circuit may include a second processing circuit coupled to the coupling circuit and configured to generate the second control signal based on the second coupling signal.

In some implementations, the trigger circuit may include a first resistor-capacitor circuit including a first resistor and a first capacitor concatenated between the electrostatic terminal and the low voltage terminal. In some implementations, the trigger circuit may include one terminal of the first resistor coupled to the electrostatic terminal, and the other terminal of the first resistor is coupled to the first capacitor. In some implementations, the trigger circuit may include one terminal of the first capacitor coupled to the first resistor, and the other terminal of the first capacitor is coupled to the low voltage terminal. In some implementations, the terminal that couples the first resistor and the first capacitor with each other may be the output terminal of the trigger circuit.

In some implementations, the trigger circuit may further include a unidirectional conduction device coupled between the first resistor and the first capacitor. In some implementations, the first resistor may be coupled to an input terminal of the unidirectional conduction device. In some implementations, the first capacitor may be coupled to the output terminal of the unidirectional conduction device. In some implementations, the terminal that couples the first resistor and the unidirectional conduction device with each other may be the output terminal of the trigger circuit.

In some implementations, the first processing circuit may include a first inverter in which the input terminal of the first inverter is coupled to the output terminal of the trigger circuit. In some implementations, the first processing circuit may include a second inverter. In some implementations, the input terminal of the second inverter may be coupled to the output terminal of the first inverter. In some implementations, the first processing circuit may include a first switching transistor. In some implementations, a control terminal of the first switching transistor may be coupled to the output terminal of the second inverter. In some implementations, a first terminal of the first switching transistor may be coupled to the electrostatic terminal. In some implementations, a second terminal of the first switching transistor may be the output terminal of the first processing circuit.

In some implementations, the second terminal of the first switching transistor may be further coupled to the input terminal of the second inverter.

In some implementations, the coupling circuit may include a second resistor. In some implementations, one terminal of the second resistor may be coupled to the electrostatic terminal.

In some implementations, the first processing circuit may include a second switching transistor. In some implementations, a control terminal of the second switching transistor may be coupled to the output terminal of the first processing circuit. In some implementations, a first terminal of the second switching transistor may be coupled to the other terminal of the second resistor. In some implementations, the second switching transistor may be turned on after receiving the first control signal.

In some implementations, the first processing circuit may include a second capacitor. In some implementations, one terminal of the second capacitor may be coupled to the low voltage terminal. In some implementations, the other terminal of the second capacitor may be coupled to the second terminal of the second switching transistor.

In some implementations, the terminal that couples the second resistor and the second switching transistor with each other may be the output terminal of the coupling circuit. In some implementations, the second resistor and the second capacitor may form a second resistor-capacitor circuit after the second switching transistor is turned on.

In some implementations, a time constant of the second resistor-capacitor circuit may be equal to the time interval between the first coupling signal and the second coupling signal.

In some implementations, the second processing circuit may include a third inverter. In some implementations, the input terminal of the third inverter may be coupled to the output terminal of the coupling circuit.

In some implementations, the second processing circuit may include a third switching transistor. In some implementations, a control terminal of the third switching transistor may be coupled to the output terminal of the third inverter. In some implementations, a first terminal of the third switching transistor may be coupled to the low voltage terminal. In some implementations, a second terminal of the third switching transistor may be the output terminal of the second processing circuit.

In some implementations, a time constant of the second resistor-capacitor circuit may be greater than the time constant of the first resistor-capacitor circuit.

In a second aspect, an implementation of the present disclosure provides a memory device, which includes the electrostatic protection circuit in any one of the foregoing implementations.

In some implementations, the electrostatic terminal of the electrostatic protection circuit may be coupled to a power supply terminal of the memory device. In some implementations, the electrostatic protection circuit may be to discharge the electrostatic signal of the power supply terminal.

In some implementations, the electrostatic terminal of the electrostatic protection circuit may be coupled to an input/output pad of the memory device. In some implementations, the electrostatic protection circuit may be to discharge the electrostatic signal of the input/output pad.

In a third aspect, an implementation of the present disclosure provides a memory system, which includes the memory device in any one of the foregoing implementations and a memory controller coupled to the memory device. In some implementations, the memory controller may be configured to control the memory device.

In a fourth aspect, an implementation of the present disclosure provides a method of electrostatic protection.

The method may include generating a first control signal, by a turning-on circuit, based on an electrostatic signal generated by an electrostatic terminal.

The method may include generating a second control signal, by a turning-off circuit, based on the first control signal.

The method may include receiving, by the discharge transistor, the first control signal at a first time. The method may include receiving, by the discharge transistor, the second control signal at a second time. The method may include performing, by the discharge transistor, electrostatic discharging between the first time and the second time.

In some implementations, the turning-on circuit may include a trigger circuit and a first processing circuit. In some implementations, the generating the first control signal, by the turning-on circuit, based on the electrostatic signal generated by the electrostatic terminal may include generating a trigger signal, by the trigger circuit, based on the electrostatic signal. In some implementations, the generating the first control signal, by the turning-on circuit, based on the electrostatic signal generated by the electrostatic terminal may include generating the first control signal, by the first processing circuit, based on the trigger signal.

In some implementations, the turning-off circuit may include a coupling circuit and a second processing circuit. In some implementations, the generating the second control signal, by the turning-off circuit, based on the first control signal may include generating a first coupling signal and a second coupling signal, by the coupling circuit, based on the first control signal. In some implementations, the time interval between the second time and the first time may be greater than or equal to the time interval between the first coupling signal and the second coupling signal.

In some implementations, the generating the second control signal, by the turning-off circuit, based on the first control signal may include generating the second control signal, by the second processing circuit, based on the second coupling signal.

In the technical solution provided by the present disclosure, the electrostatic protection circuit includes a turning-on circuit and a turning-off circuit, and the turning-on and turning-off of the discharge transistor are controlled by the first control signal generated by the turning-on circuit and the second control signal generated by the turning-off circuit respectively, the discharge transistor receives the first control signal and the second control signal at the first time and the second time respectively, and completes electrostatic discharging between the first time and the second time, the electrostatic protection circuit is able to ensure sufficient electrostatic discharging while having strong anti-interference ability.

DETAILED DESCRIPTION

Figure 1A:
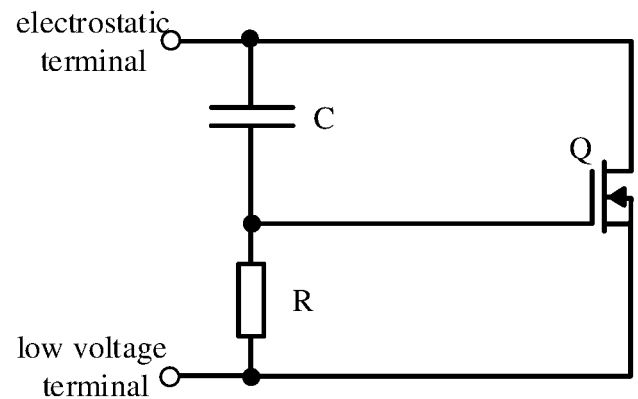
FIGS. 1a and 1b are circuit diagrams of the electrostatic protection circuit.

Exemplary implementations of the present disclosure will be described in more detail below with reference to the accompanying drawings. Although exemplary implementations of the present disclosure are shown in the accompanying drawings, it should be understood that the present disclosure may be implemented in various forms and should not be limited to the specific implementations set forth herein. Rather, these implementations are provided so that the present disclosure can be more thoroughly understood, and the scope of the present disclosure can be fully conveyed to those skilled in the art.

In the following description, numerous specific details are given in order to provide a more thorough understanding of the present disclosure. However, it will be apparent to one skilled in the art that the present disclosure may be practiced without one or more of these details. In other examples, in order to avoid confusion with the present disclosure, some technical features known in the art are not described; that is, not all features of the actual implementations are described here, and well-known functions and structures are not described in detail.

In the appended drawings, like reference numerals refer to like elements throughout.

It should be understood that the spatially relative terms such as "beneath", "below", "lower", "under", "above", "on", etc., may be used herein for ease of description to describe one element or feature's relationship to another element(s) or feature(s) as illustrated in the appended drawings. It will be understood that the spatially relative terms are intended to encompass different orientations of the device in use or operations in addition to the orientation depicted in the appended drawings. For example, if the device in the appended drawings is turned over, an element or a feature described as "below" or "beneath" or "under" another element or feature would then be oriented "above" the another element or feature. Thus, exemplary terms "below" and "under" may encompass both orientations of up and down. A device may be otherwise oriented (rotated 90 degrees or at other orientations) and the spatially descriptive terms used herein should be interpreted accordingly.

A term used herein is for the purpose of describing a particular implementation only and is not to be considered as limitation of the present disclosure. As used herein, the singular forms "a", "an" and "said/the" are intended to include the plural forms as well, unless the context clearly dictates otherwise. It should also be understood that the terms "consists of" and/or "comprising", when used in this description, identify the presence of stated features, integers, steps, operations, elements and/or parts, but do not exclude the presence or addition of one or more other features, integers, steps, operations, elements, parts and/or groups. As used herein, the term "and/or" includes any and all combinations of the associated listed items.

With the increasing development of semiconductor chip manufacturing process and the increasing improvement of integration of the circuit, the voltage endurance capability of electronic components is reduced accordingly, and the damage of electrostatic discharge (ESD) to chips is becoming more and more significant. Therefore, it is required to perform electrostatic protection on the chip, and a common method is to set an electrostatic protection circuit in the chip.

An electrostatic protection circuit is usually triggered by a resistor-capacitor circuit, and in order to ensure sufficient electrostatic discharging, the anti-interference ability of the electrostatic protection circuit will be sacrificed, thus causing the electrostatic protection circuit to be easily triggered by noise and the normal operation of the chip to be affected. Therefore, how to improve the anti-interference ability and reliability of the electrostatic protection circuit simultaneously is an urgent problem to be solved at present.

Figure 1B:
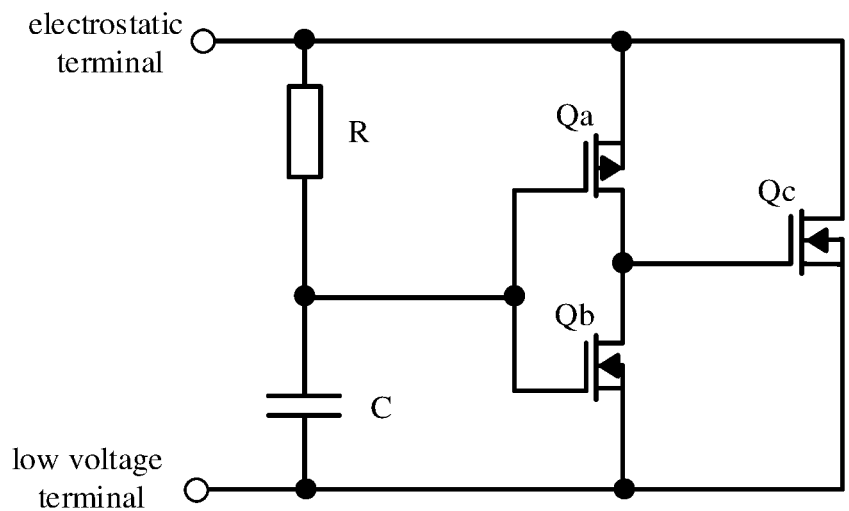

FIGS. 1a and 1b are circuit diagrams of the electrostatic protection circuit. As shown in FIG. 1a, the electrostatic protection circuit includes a resistor R, a capacitor C and a transistor Q. The resistor R and the capacitor C compose a resistor-capacitor circuit (RC circuit), and the transistor Q is a discharge transistor. When an electrostatic signal is input to the electrostatic terminal, the output terminal of the resistor-capacitor circuit is at a logic high level, which causes the transistor Q to turn on, and conducts electrostatic discharging through the transistor Q.

As shown in FIG. 1b, the electrostatic protection circuit includes a resistor R, a capacitor C, a transistor Qa, a transistor Qb and a transistor Qc. The resistor R and the capacitor C compose an RC circuit, the transistor Qa and the transistor Qb compose an inverter, and the transistor Qc is a discharge transistor. When an electrostatic signal is input to the electrostatic terminal, the output terminal of the resistor-capacitor circuit is at a logic low level, the output terminal of the inverter is at a logic high level, the transistor Qc is turned on, and electrostatic discharging is conducted through the transistor Qc.

The two electrostatic protection circuits described above are transient trigger discharge circuits, which use the resistor-capacitor circuit to transiently trigger the channel discharge of the transistor to implement electrostatic discharging, and the time during which the transistor remains on depends on the time constant (RC value) of the resistor-capacitor circuit. Generally, the duration of electrostatic discharge is between hundreds of nanoseconds and several microseconds, therefore, in order to achieve sufficient electrostatic discharging, the time constant of the resistor-capacitor circuit is required to reach hundreds of nanoseconds or even several microseconds.

However, in practical applications, there are noise signals on the order of microseconds or even hundreds of nanoseconds at the electrostatic terminal, and in the case that the time constant of the resistor-capacitor circuit is large, the lower limit of the frequency of the electrical signal that will trigger the electrostatic protection circuit is low, which will cause the electrostatic protection circuit to be easily triggered by noise signals which are in low frequency, thereby resulting in large current leakage, causing increased power consumption of the chip, interfering with the normal operation of the chip, and even possibly causing the chip to be burned.

Therefore, it is necessary to improve the anti-interference ability of the electrostatic protection circuit under the condition of ensuring sufficient electrostatic discharging.

In this regard, the present disclosure proposes the following implementations.

Figure 2:
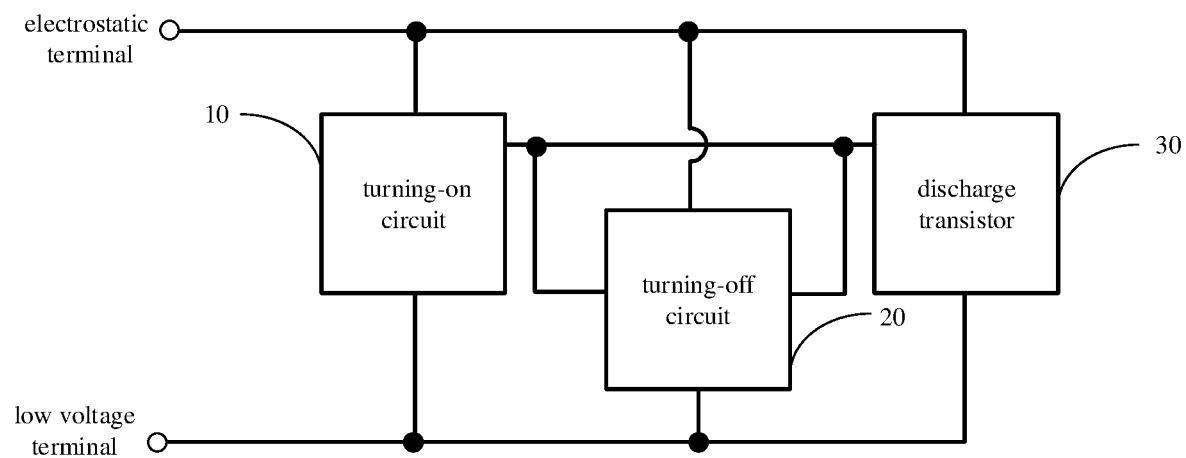
FIGS. 2 and 3 are schematic diagrams of the circuit structure of the electrostatic protection circuit provided by an implementation of the present disclosure.

FIG. 2 is a schematic structural diagram of an electrostatic protection circuit provided by an implementation of the present disclosure, as shown in FIG. 2, the electrostatic protection circuit includes a turning-on circuit 10, a turning-off circuit 20 and a discharge transistor 30.

In an implementation of the present disclosure, the turning-on circuit 10 is coupled to an electrostatic terminal and configured to generate a first control signal based on an electrostatic signal generated by the electrostatic terminal; the turning-off circuit 20 is coupled to the turning-on circuit 10 and configured to generate a second control signal based on the first control signal; a control terminal of the discharge transistor 30 is coupled to both the turning-on circuit 10 and the turning-off circuit 20, a first terminal of the discharge transistor 30 is coupled to a low voltage terminal, and a second terminal of the discharge transistor 30 is coupled to the electrostatic terminal; the discharge transistor 30 is configured to: receive the first control signal at a first time, receive the second control signal at a second time, and perform electrostatic discharging between the first time and the second time.

In the implementation of the present disclosure, the turning-on and turning-off of the discharge transistor 30 are controlled by the first control signal generated by the turning-on circuit 10 and the second control signal generated by the turning-off circuit 20 respectively. The discharge transistor 30 receives the first control signal and turns on at the first time, receives the second control signal and turns off at the second time, and the discharge transistor 30 starts to perform electrostatic discharging based on the first control signal, and completes electrostatic discharging upon or before receiving the second control signal, i.e., the time interval between the second time and the first time is greater than or equal to the time for electrostatic discharging.

It should be noted that the time required to discharge the electrostatic signal generated in the semiconductor chip ranges from 100 nanoseconds to 1 microsecond, therefore, in an implementation of the present disclosure, the time interval between the second time and the first time is at least greater than 1 microsecond.

Figure 3:
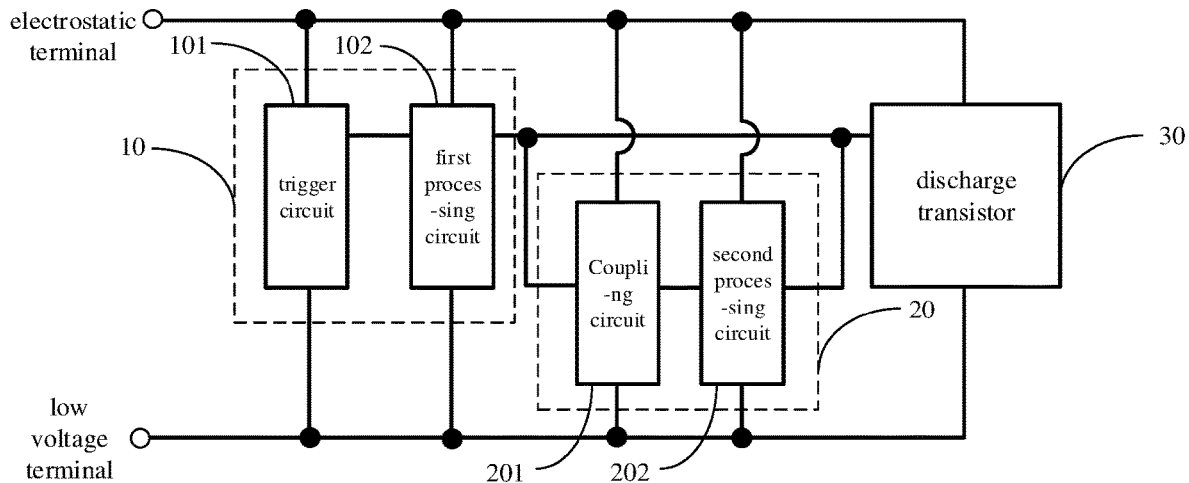

In some implementations, referring to FIG. 3, the turning-on circuit 10 includes a trigger circuit 101 and a first processing circuit 102, and the turning-off circuit 20 includes a coupling circuit 201 and a second processing circuit 202.

In some implementations, the trigger circuit 101 is coupled to the electrostatic terminal and configured to generate a trigger signal based on the electrostatic signal.

Figure 4:
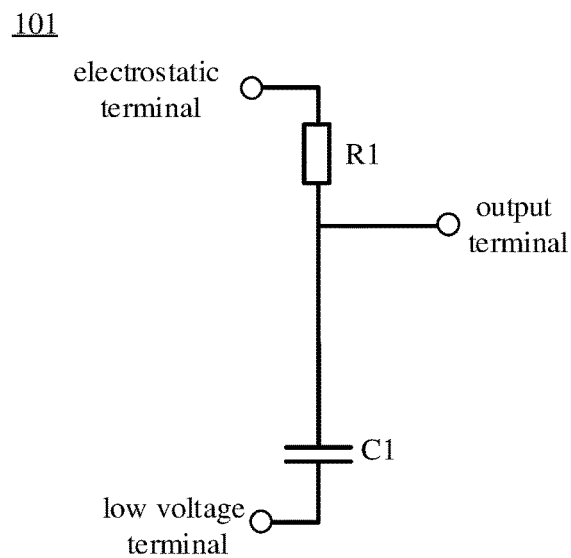
FIG. 4 is a circuit diagram of a trigger circuit provided by an implementation of the present disclosure.

FIG. 4 is a circuit diagram of a trigger circuit 101 provided by an implementation of the present disclosure, the trigger circuit 101 includes a first resistor-capacitor circuit, the first resistor-capacitor circuit includes a first resistor R1 and a first capacitor C1 concatenated between the electrostatic terminal and the low voltage terminal; one terminal of the first resistor R1 is coupled to the electrostatic terminal, and the other terminal of the first resistor R1 is coupled to the first capacitor C1; one terminal of the first capacitor C1 is coupled to the first capacitor C1, and the other terminal of the first capacitor C1 is coupled to the low voltage terminal; the terminal that couples the first resistor R1 and the first capacitor C1 with each other is the output terminal of the trigger circuit 101.

In the implementation of the present disclosure, when the electrostatic terminal generates an electrostatic signal, i.e., when the frequency of the electrical signal at the electrostatic terminal is higher than the reciprocal of the time constant R1C1 of the first resistor-capacitor circuit, the trigger circuit 101 generates a trigger signal and outputs the trigger signal to the first processing circuit 102 via the output terminal.

Figure 5:
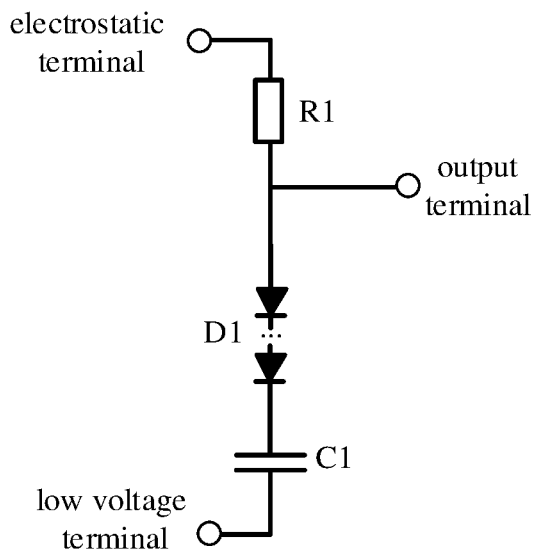
FIG. 5 is a circuit diagram of a trigger circuit provided by another implementation of the present disclosure.

In some implementations, referring to FIG. 5, the trigger circuit 101 further includes an unidirectional conduction device concatenated between the first resistor R1 and the first capacitor C1; the first resistor R1 is coupled to an input terminal of the unidirectional conduction device D1; the first capacitor C1 is coupled to the output terminal of the unidirectional conduction device D1; the terminal that couples the first resistor R1 and the unidirectional conduction device D1 with each other is the output terminal of the trigger circuit 101.

In some implementations, the unidirectional conduction device D1 is composed of at least one diode in series, the input terminal of the unidirectional conduction device D1 is the input terminal of the diode closest to the first resistor R1, and the output terminal of the unidirectional conduction device D1 is the output terminal of the diode closest to the first capacitor C1, and the conduction voltage of the unidirectional conduction device D1 is equal to the sum of conduction voltages of the diodes.

In some specific examples, the number of diodes in the unidirectional conduction device D1 ranges from 1 to 10.

In some specific examples, the time constant R1C1 of the first resistor-capacitor circuit ranges from 5 nanoseconds to 15 nanoseconds.

In the implementation of the present disclosure, the reciprocal of the time constant R1C1 of the first resistor-capacitor circuit in the trigger circuit 101 determines the lower limit of the frequency of the electrostatic signal, and the conduction voltage of the unidirectional conduction device D1 determines the lower limit of the electrostatic signal voltage, i.e., only when the frequency of the electrical signal generated at the electrostatic terminal is higher than the reciprocal of the time constant R1C1 of the first resistor-capacitor circuit, and the voltage of the electrical signal is higher than the conduction voltage of the unidirectional conduction device D1, the trigger circuit 101 will generate a trigger signal and output the trigger signal to the first processing circuit 102 via the output terminal, thereby, false triggering of the electrostatic protection circuit caused by low voltage noise and low-frequency noise may be avoided, and the anti-interference ability of the electrostatic protection circuit may be effectively improved.

In the implementation of the present disclosure, the trigger signal is at a logic low level.

In some implementations, the first processing circuit 102 is coupled to the trigger circuit 101 and configured to generate the first control signal based on the trigger signal.

Figure 6:
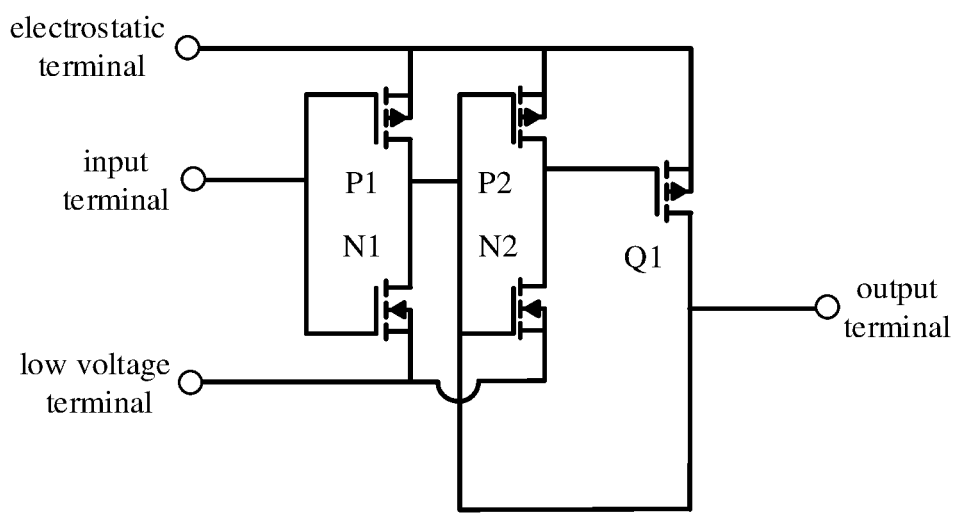
FIG. 6 is a circuit diagram of a first processing circuit provided by an implementation of the present disclosure.

FIG. 6 is a circuit diagram of the first processing circuit 102 provided by an implementation of the present disclosure, and the first processing circuit 102 includes a first inverter composed of a first PMOS transistor P1 and a first NMOS transistor N1, a second inverter composed of a second PMOS transistor P2 and a second NMOS transistor N2, and a first switching transistor Q1. The input terminal of the first inverter is coupled to the output terminal of the trigger circuit 101, the input terminal of the second inverter is coupled to the output terminal of the first inverter, and the control terminal of the first switching transistor Q1 is coupled to the output terminal of the second inverter.

In the implementation of the present disclosure, the first switching transistor Q1 is a PMOS transistor, the first terminal of the first switching transistor Q1 is coupled to the electrostatic terminal, and the second terminal of the first switching transistor Q1 is the output terminal of the first processing circuit 102.

It should be noted that, in the implementation of the present disclosure, the first terminal of the transistor is a source terminal, and the second terminal of the transistor is a drain terminal.

In the implementation of the present disclosure, the trigger circuit 101 generates a trigger signal based on the electrostatic signal and outputs the trigger signal to the first processing circuit 102, the trigger signal is at a logic low level, after passing through the first inverter and the second inverter in the first processing circuit 102, the control terminal of the first switching transistor Q1 is at a logic low level, the first switching transistor Q1 is turned on and generates a first control signal that is output to the control terminal of the turning-off circuit 20 and the discharge transistor 30, the first control signal is at a logic high level. Since the time constant R1C1 of the first resistor-capacitor circuit in the trigger circuit 101 is relatively small, after the trigger circuit 101 generating the trigger signal, the first capacitor C1 is quickly charged, and the output terminal of the trigger circuit 101 changes to a logic high level, the control terminal of the first switching transistor Q1 then changes to a logic high level, and the first switching transistor Q1 is turned off. At this point, the output terminal of the first processing circuit 102 is maintained at a logic high level.

In some implementations, as shown in FIG. 6, the output terminal of the first processing circuit 102 is also coupled to the input terminal of the second inverter, and the first switching transistor Q1 and the second inverter compose a feedback loop to maintain a stable output of the first control signal when the first processing circuit 102 receives the trigger signal.

In some implementations, the coupling circuit 201 is coupled to the first processing circuit 102 and configured to generate a first coupling signal and a second coupling signal based on the first control signal.

Figure 7:
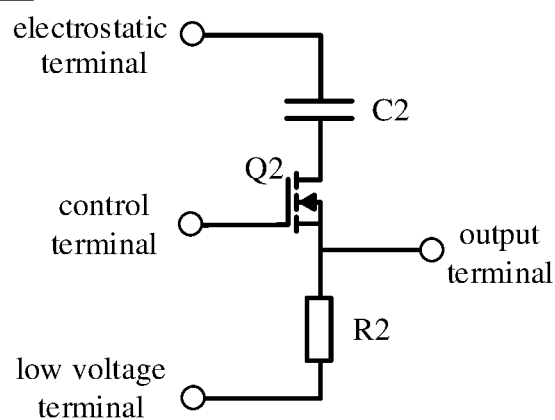
FIG. 7 is a circuit diagram of a coupling circuit provided by an implementation of the present disclosure.

FIG. 7 is a circuit diagram of a coupling circuit 201 provided by an implementation of the present disclosure, the coupling circuit 201 includes a second switching transistor Q2, a second capacitor C2 and a second resistor R2. One terminal of the second resistor R2 is coupled to the low voltage terminal; the control terminal of the second switching transistor Q2 is coupled to the output terminal of the first processing circuit 102, a first terminal of the second switching transistor Q2 is coupled to the other terminal of the second resistor R2; one terminal of the second capacitor C2 is coupled to the electrostatic terminal, and the other terminal of the second capacitor C2 is coupled to a second terminal of the second switching transistor Q2; a terminal that couples the second resistor R2 and the second switching transistor Q2 with each other is the output terminal of the coupling circuit 201.

In the implementation of the present disclosure, the second switching transistor Q2 is an NMOS transistor. The second switching transistor Q2 is turned on after receiving the first control signal, which causes the second resistor R2 to couple with the second capacitor C2 to compose a second resistor-capacitor circuit, at this point, the second capacitor C2 starts to discharge and the coupling circuit 201 generates the first coupling signal, after a period of time, the second capacitor C2 completes discharging, and the coupling circuit 201 generates a second coupling signal. Here, the time interval between the second coupling signal and the first coupling signal is equal to the time constant R2C2 of the second resistor-capacitor circuit.

In an implementation of the present disclosure, the first coupling signal is at a logic high level, and the second coupling signal is at a logic low level.

In the implementation of the present disclosure, the time constant R2C2 of the second resistor-capacitor circuit is greater than the time constant R1C1 of the first resistor-capacitor circuit. When no electrostatic signal is generated at the electrostatic terminal, the second switching transistor Q2 is in an off state, and only after that an electrostatic signal is generated at the electrostatic terminal and the turning-on circuit 10 generates the first control signal, the second switching transistor Q2 will be turned on, and the second resistor R2 and the second capacitor C2 will compose the second resistor-capacitor circuit, thus the second resistor-capacitor circuit with a large time constant may be in a masked state when no static signal is generated, thereby preventing the low-frequency noise at the static terminal from causing the second resistor-capacitor circuit to be falsely triggered, and effectively improving the anti-interference ability of the static protection circuit.

In some specific examples, the time constant R2C2 of the second resistor-capacitor circuit ranges from 1 microsecond to 1.5 microseconds.

In some implementations, the second processing circuit 202 is coupled to the coupling circuit 201 and configured to generate a second control signal based on the second coupling signal.

Figure 8:
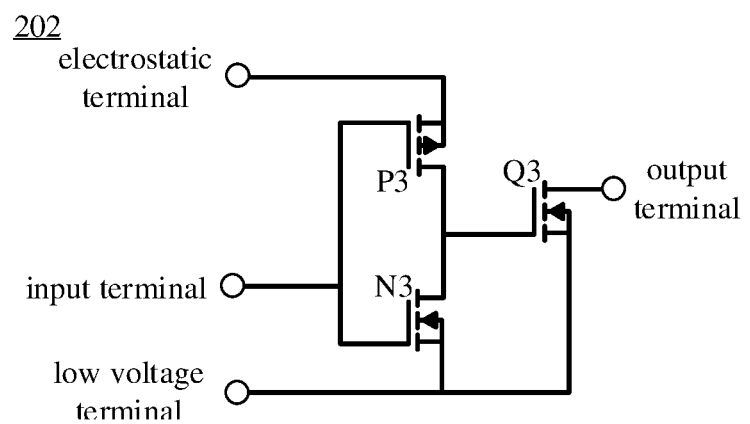
FIG. 8 is a circuit diagram of a second processing circuit provided by an implementation of the present disclosure.

FIG. 8 is a circuit diagram of a second processing circuit 202 provided by an implementation of the present disclosure, the second processing circuit 202 includes a third inverter composed of a third PMOS transistor P3 and a third NMOS transistor N3, and a third switching transistor Q3. The input terminal of the third inverter is coupled to the output terminal of the coupling circuit 201, the control terminal of the third switching transistor Q3 is coupled to the output terminal of the third inverter, a first terminal of the third switching transistor Q3 is coupled to the low voltage terminal, and a second terminal of the third switching transistor Q3 is an output terminal of the second processing circuit 202.

In an implementation of the present disclosure, the third switching transistor Q3 is an NMOS transistor, and after the second processing circuit 202 receiving the first coupling signal, the control terminal of the third switching transistor Q3 is at a logic low level, and the third switching transistor Q3 maintains the off state; after the second processing circuit 202 receiving the second coupling signal, the control terminal of the third switching transistor Q3 changes to a logic high level, the third switching transistor Q3 is turned on, and generates a second control signal that is output to the control terminal of the discharge transistor 30. Here, the second control signal is at a logic low level.

Figure 9:
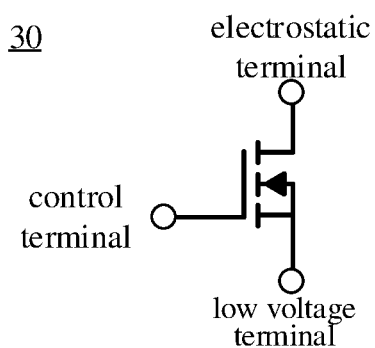
FIG. 9 is a schematic diagram of a discharge transistor provided by an implementation of the present disclosure.

FIG. 9 is a schematic diagram of a discharge transistor 30 provided by an implementation of the present disclosure, a first terminal and a second terminal of the discharge transistor 30 are coupled to the low voltage terminal and the static terminal, respectively, and the control terminal of the discharge transistor 30 is coupled to the output terminal of the first processing circuit 102 and the output terminal of the second processing circuit 202.

In the implementation of the present disclosure, the discharge transistor 30 is an NMOS transistor. The discharge transistor 30 receives the first control signal and turns on at the first time, and the electrostatic signal generated by the electrostatic terminal is discharge to the low voltage terminal via the channel of the discharge transistor 30; the discharge transistor 30 receives the second control signal and turns off at the second time. The discharge transistor 30 conducts electrostatic discharging between the first time and the second time.

In an implementation of the present disclosure, the time interval between the second time and the first time is greater than or equal to the time interval between the second coupling signal and the first coupling signal, and the time interval between the second coupling signal and the first coupling signal is equal to the time constant R2C2 of the second resistor-capacitor circuit, since the time constant R2C2 of the second resistor-capacitor circuit is relatively large, and the discharge transistor 30 will be turned off only after receiving the second control signal, it may be ensured that the electrostatic discharging is completed upon or before the discharge transistor 30 receives the second control signal.

Figure 10:
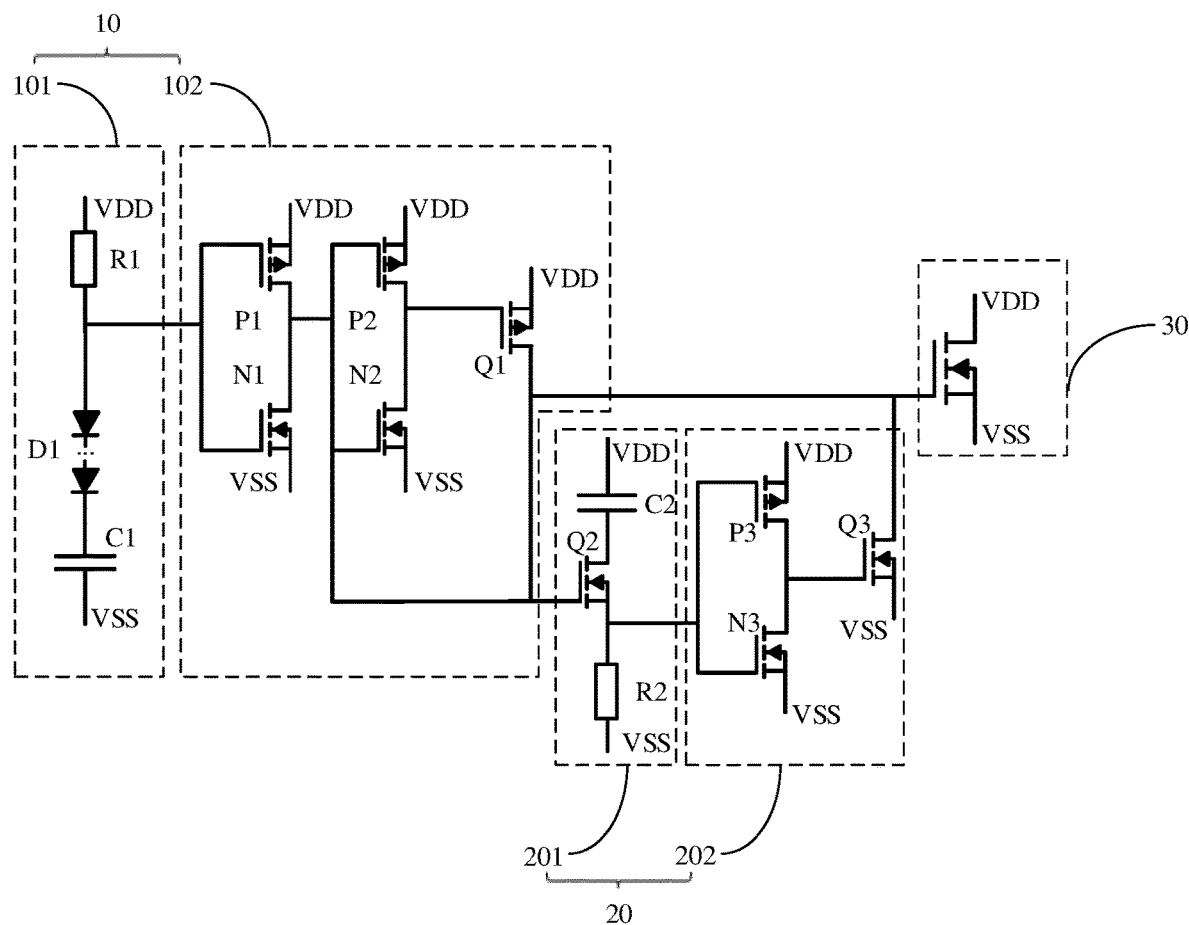
FIG. 10 is a circuit diagram of an electrostatic protection circuit provided by an implementation of the present disclosure.

FIG. 10 is a circuit diagram of an electrostatic protection circuit provided by an implementation of the present disclosure. As shown in FIG. 10, the electrostatic protection circuit includes a turning-on circuit 10 composed of a trigger circuit 101 and a first processing circuit 102, a turning-off circuit 20 composed of a coupling circuit 201 and a second processing circuit 202, and a discharge transistor 30.

It should be noted that, in an implementation of the present disclosure, taking the electrostatic terminal of the electrostatic protection circuit being coupled to the power supply terminal, and the low voltage terminal being coupled to the ground terminal as an example, i.e., the electrostatic terminal is connected to the power supply voltage VDD, and the low voltage terminal is connected to the ground voltage VSS. In practical applications, the electrostatic terminal of the electrostatic protection circuit may be coupled to other circuits that may generate electrostatic signals, and the low voltage terminal may be coupled to other circuits capable of conducting electrostatic discharging or collecting electrostatic charges, which is not limited in the present disclosure.

In the implementation of the present disclosure, the turning-on and turning-off of the discharge transistor 30 are controlled by the first control signal generated by the turning-on circuit 10 and the second control signal generated by the turning-off circuit 20 respectively.

In the turning-on circuit 10, when no electrostatic signal is generated at the electrostatic terminal, the output terminal of the trigger circuit 101 is at a logic high level, and the control terminal of the first switching transistor Q1 in the first processing circuit 102 is at a logic high level, and the first switching transistor Q1 is in an off state. When the electrostatic terminal generates an electrostatic signal, the trigger circuit 101 generates a trigger signal, and the trigger signal is at a logic low level, the control terminal of the first switching transistor Q1 in the first processing circuit 102 is at a logic low level, the first switching transistor Q1 is turned on and outputs a first control signal to the control terminal of the turning-off circuit 20 and the discharge transistor 30, the first control signal is at a logic high level. Since the time constant R1C1 of the first resistor-capacitor circuit in the trigger circuit 101 is relatively small, the first capacitor C1 in the trigger circuit 101 is charged quickly, and the output terminal of the trigger circuit 101 changes to a logic high level, the control terminal of the first switching transistor Q1 then changes to a logic high level, and the first switching transistor Q1 is turned off and the output terminal of the turning-on circuit 10 maintains at a logic high level.

In the turning-off circuit 20, the second switching transistor Q2 in the coupling circuit 201 is turned on after receiving the first control signal, and the second resistor R2 and the second capacitor C2 in the coupling circuit 201 compose a second resistor-capacitor circuit, the coupling circuit 201 outputs the first coupling signal, the first coupling signal is at a logic high level, the control terminal of the third switching transistor Q3 in the second processing circuit 202 is at a logic low level, and the third switching transistor Q3 remains in the off state, after the discharge of the second capacitor C2 being completed, the coupling circuit 201 outputs the second coupling signal, the second coupling signal is at a logic low level, and the control terminal of the third switching transistor Q3 is at a logic high level, the third switching transistor Q3 is turned on and generates a second control signal, which is at a logic low level.

The discharge transistor 30 receives the first control signal at the first time, the discharge transistor 30 is turned on and remains in the on state, and the electrostatic signal generated by the electrostatic terminal is discharged to the low voltage terminal via the channel of the discharge transistor 30; the discharge transistor 30 receives the second control signal at the second time, the discharge transistor 30 turns off. The discharge transistor 30 completes electrostatic discharging between the first time and the second time.

In an implementation of the present disclosure, the reciprocal of the time constant R1C1 of the first resistor-capacitor circuit in the turning-on circuit 10 determines the lower limit of the frequency of the electrostatic signal, the time constant R1C1 of the first resistor-capacitor circuit is small (on the order of nanoseconds), which may increase the lower limit of the frequency of the electrostatic signal, prevent the electrostatic protection circuit from being falsely triggered due to low-frequency noise, and improve the anti-interference ability of the static protection circuit.

In an implementation of the present disclosure, the time constant R2C2 of the second resistor-capacitor circuit in the turning-off circuit 20 determines the time interval between the second time and the first time, i.e., the time interval between the turning-off and turning-on of the discharge transistor 30, the time constant R2C2 of the second resistor-capacitor circuit is relatively large (on the order of nanoseconds), which may ensure sufficient electrostatic discharging and improve the reliability of the electrostatic electricity protection circuit.

In the implementation of the present disclosure, the turning-off circuit 20 is provided with a second switching transistor Q2, and only when the turning-on circuit 10 generates the first control signal based on the electrostatic signal, the second switching transistor Q2 will be turned on, and when no electrostatic signal is generated, the turning-off circuit 20 is in a masked state, thereby preventing the second resistor-capacitor circuit with a large time constant from being falsely triggered due to low-frequency noise at the electrostatic terminal, and effectively improving the anti-interference ability of the electrostatic protection circuit.

In the implementation of the present disclosure, the trigger circuit 101 is provided with an unidirectional conduction device D1, and the conduction voltage of the unidirectional conduction device D1 determines the lower limit of the electrostatic signal voltage, which may prevent the electrostatic protection circuit from being falsely triggered due to low voltage noise and improve the anti-interference ability of the electrostatic protection circuit.

In the implementation of the present disclosure, the first switching transistor Q1 and the second inverter in the first processing circuit 102 compose a feedback loop, which may maintain a stable output of the first control signal when the first processing circuit 102 receives the trigger signal, thereby improving the reliability of the electrostatic protection circuit.

Figure 11:
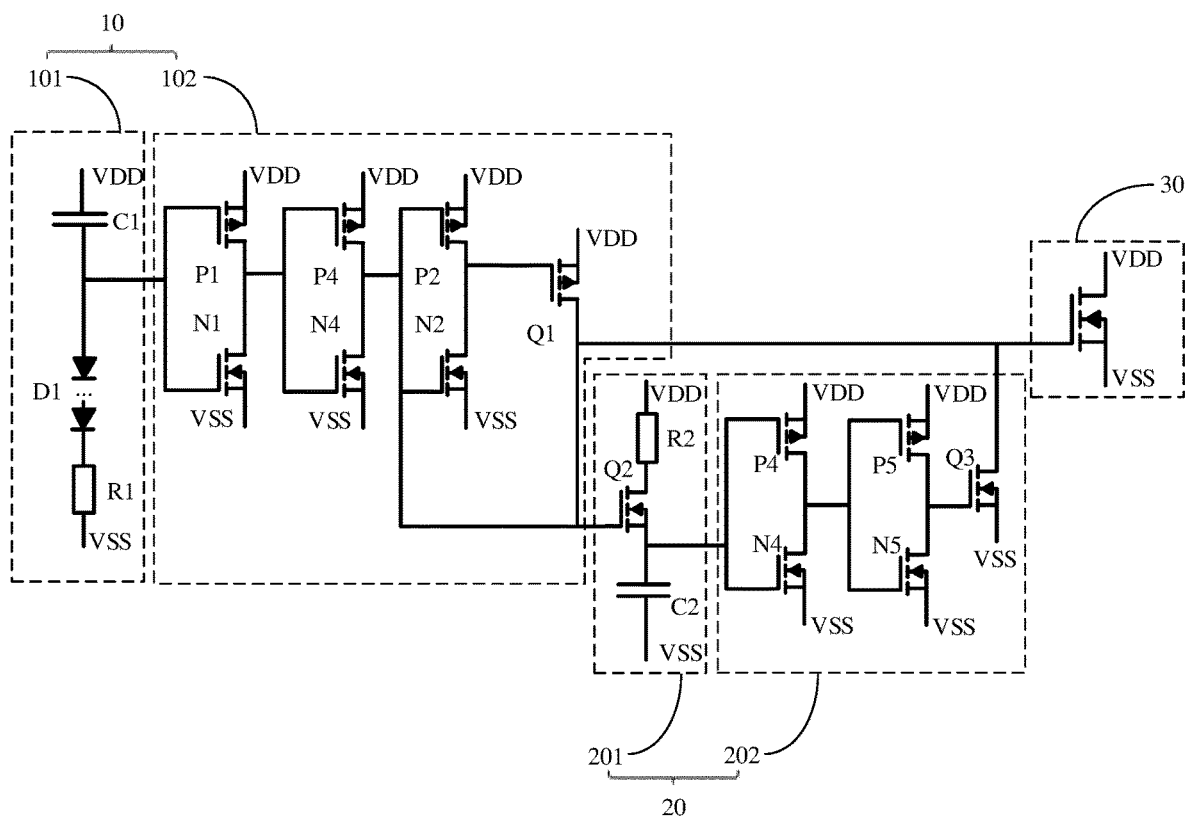
FIG. 11 is a circuit diagram of an electrostatic protection circuit provided by another implementation of the present disclosure.

FIG. 11 is a circuit diagram of an electrostatic protection circuit provided by another implementation of the present disclosure. As shown in FIG. 11, in the turning-on circuit 10 of the electrostatic protection circuit, one terminal of the first capacitor C1 in the trigger circuit 101 is coupled to the electrostatic terminal, and the other terminal of the first capacitor C1 is coupled to the input terminal of the unidirectional conduction device D1, one terminal of the first resistor R1 is coupled to the low voltage terminal, and the other terminal of the first resistor R1 is coupled to the output terminal of the unidirectional conduction device D1, when the electrostatic terminal generates an electrostatic signal, the trigger circuit 101 generates a trigger signal, which is at a logic high level. The first processing circuit 102 further includes a fourth inverter composed of a fourth PMOS transistor P4 and a fourth NMOS transistor N4, the first processing circuit 102 generates a first control signal based on the trigger signal, and the first control signal is at a logic high level.

In the turning-off circuit 20 of the electrostatic protection circuit, one terminal of the second resistor R2 in the coupling circuit 201 is coupled to the electrostatic terminal, the other terminal of the second resistor R2 is coupled to the second terminal of the second switching transistor Q2, one terminal of the second capacitor C2 is coupled to the low voltage terminal, and the other terminal of the second capacitor C2 is coupled to the first terminal of the second switching transistor Q2. The coupling circuit 201 generates a first coupling signal based on the first control signal and generates a second coupling signal, the first coupling signal is at a logic low level, and the second coupling signal is at a logic high level. The second processing circuit 202 further includes a fifth inverter composed of a fifth PMOS transistor P5 and a fifth NMOS transistor N5, the second processing circuit 202 generates a second control signal based on the second coupling signal, and the second control signal is at a logic low level.

In some implementations, when the number of inverters in the first processing circuit 102 is an even number, the first resistor R1 is coupled between the electrostatic terminal and the input terminal of the unidirectional conduction device D1, and the first capacitor C1 is coupled between the low voltage terminal and the output terminal of the unidirectional conduction device D1; when the number of inverters in the first processing circuit 102 is an odd number, the first capacitor C1 is coupled between the electrostatic terminal and the input terminal of the unidirectional conduction device D1, and the first resistor R1 is coupled between the low voltage terminal and the output terminal of the unidirectional conduction device D1; when the number of inverters in the second processing circuit 202 is an odd number, the second capacitor C2 is coupled between the electrostatic terminal and the second terminal of the second switching transistor Q2, and the second resistor R2 is coupled between the low voltage terminal and the first terminal of the second switching transistor Q2; when the number of inverters in the second processing circuit 202 is an even number, the second resistor R2 is coupled between the electrostatic terminal and the second terminal of the second switching transistor Q2, and the second capacitor C2 is coupled between the low voltage terminal and the first terminal of the second switching transistor Q2. That is, in the implementation of the present disclosure, by changing the number of inverters in the first processing circuit 102 and the second processing circuit 202, and adaptively adjusting the relative position of the first resistor R1 and the first capacitor C1 as well as the relative position of the second resistor R2 and the second capacitor C2, when the number of inverters increases, the signal transmission in the circuit will be more stable, so that the reliability of the electrostatic protection circuit may be further improved.

Based on the same inventive concept as the electrostatic protection circuit described above, an implementation of the present disclosure further provides a memory device, which includes the electrostatic protection circuit in any one of the foregoing implementations.

The memory device may be any memory in this disclosure. For example, NAND flash memory (e.g., three-dimensional (3D) NAND flash memory).

Figure 12:
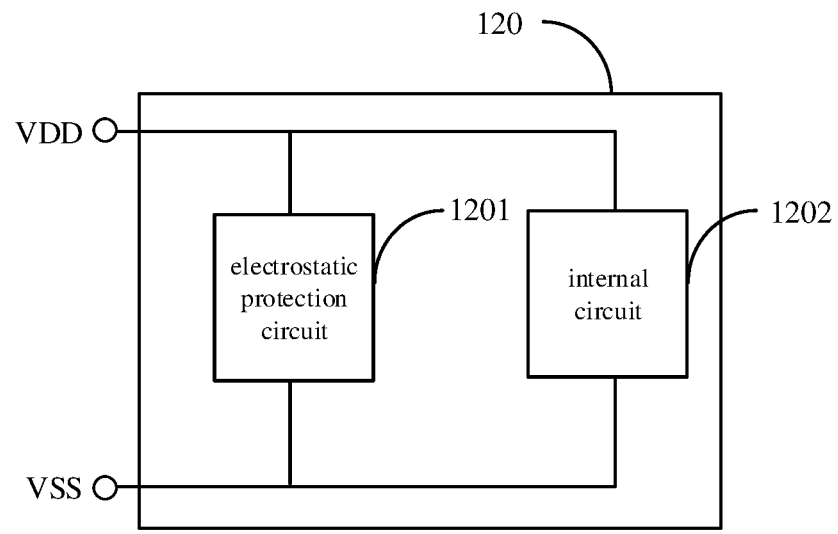
FIG. 12 is a schematic diagram of a memory device provided by an implementation of the present disclosure.

In some implementations, referring to FIG. 12, the electrostatic terminal of the electrostatic protection circuit 1201 is coupled to a power supply terminal of the memory device 120; the electrostatic protection circuit 1201 is to discharge the electrostatic signal of power supply terminal.

Here, the external power supply provides the power supply voltage VDD to the memory device 120 through the power supply terminal of the memory device 120, and the electrostatic protection circuit 1201 is coupled between the power supply terminal and the ground terminal of the memory device 120, when an electrostatic signal is generated at the power supply terminal, the electrostatic signal may be discharge to the ground terminal through the electrostatic protection circuit 1201, thereby preventing the electrostatic signal from entering into the internal circuit 1202 of the memory device 120 and causing damage to the internal circuit 1202.

In some implementations, FIG. 10 is a circuit diagram of the electrostatic protection circuit 1201, the electrostatic protection circuit 1201 has a strong anti-interference ability, which may prevent the low-frequency noise and low voltage noise generated at the power supply terminal from causing the electrostatic protection circuit to be falsely triggered, and can ensure sufficient electrostatic discharging, thus the memory device 120 has high reliability.

Figure 13:
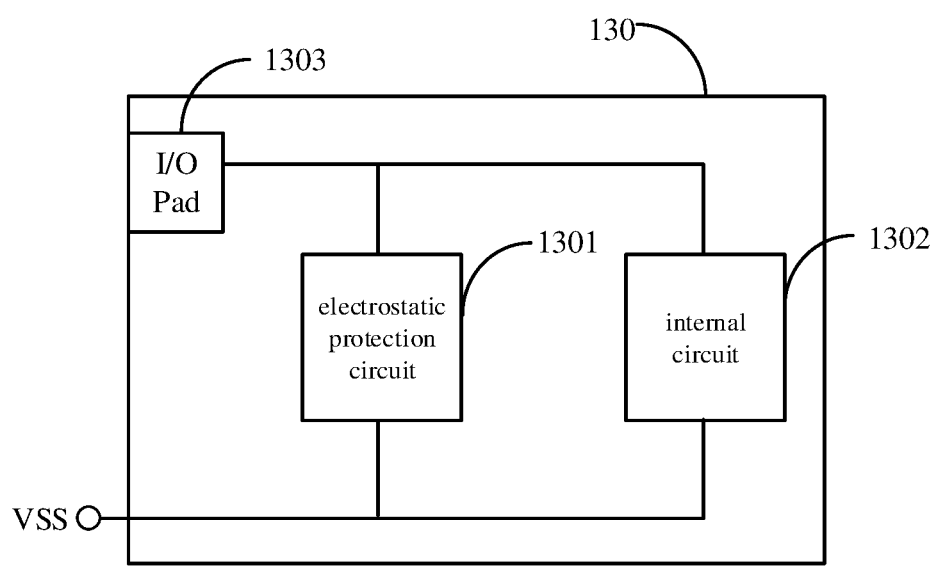
FIG. 13 is a schematic diagram of a memory device provided by another implementation of the present disclosure.

In some implementations, referring to FIG. 13, the electrostatic terminal of the electrostatic protection circuit 1301 is coupled to an input/output pad 1303 of the memory device 130; the electrostatic protection circuit 1301 is to discharge the electrostatic signal of the input/output pad 1303.

Here, the electrostatic protection circuit 1301 is coupled between the input/output pad 1303 and the ground terminal of the memory device 130, when an electrostatic signal is generated at the input/output pad, the electrostatic signal may be discharge to the ground terminal through the electrostatic protection circuit 1301, thereby preventing the electrostatic signal from entering into the internal circuit 1302 of the memory device 130 and preventing electrostatic signals with high-voltage and high-frequency from causing damage to the internal circuit 1302 of the memory device 130.

In some implementations, FIG. 10 is a circuit diagram of the electrostatic protection circuit 1301, the electrostatic protection circuit 1301 has a strong anti-interference ability and can ensure sufficient electrostatic discharging, thus the memory device 130 has high reliability.

Based on the same inventive concept as the electrostatic protection circuit described above, an implementation of the present disclosure provides a memory system, the memory system includes the memory device in any one of the foregoing implementations and a memory controller coupled to the memory device, the memory controller being configured to control the memory device. The technical effects achieved by the memory devices in some of the aforementioned implementations can also be achieved by this memory system, and will not be described in detail here.

In some implementations, a memory system may be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having memory therein.

In some implementations, a memory controller and one or more memory devices may be integrated into various types of storage devices, e.g., included in the same package (e.g., Universal Flash Storage (UFS) package or eMMC package). That is, a memory system may be implemented and packaged into different types of terminal electronic products.

In some specific examples, a memory controller and a single memory device may be integrated into a memory card. A memory card may include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc.

In other specific examples, the memory controller and multiple memory devices may be integrated into a solid-state drive (SSD). In some implementations, the storage capacity and/or operating speed of the solid-state drive is greater than the storage capacity and/or operating speed of the memory card.

Based on the same inventive concept as the electrostatic protection circuit described above, an implementation of the present disclosure further provides a method of electrostatic protection. The method of electrostatic protection is applied to an electrostatic protection circuit.

Figure 14:
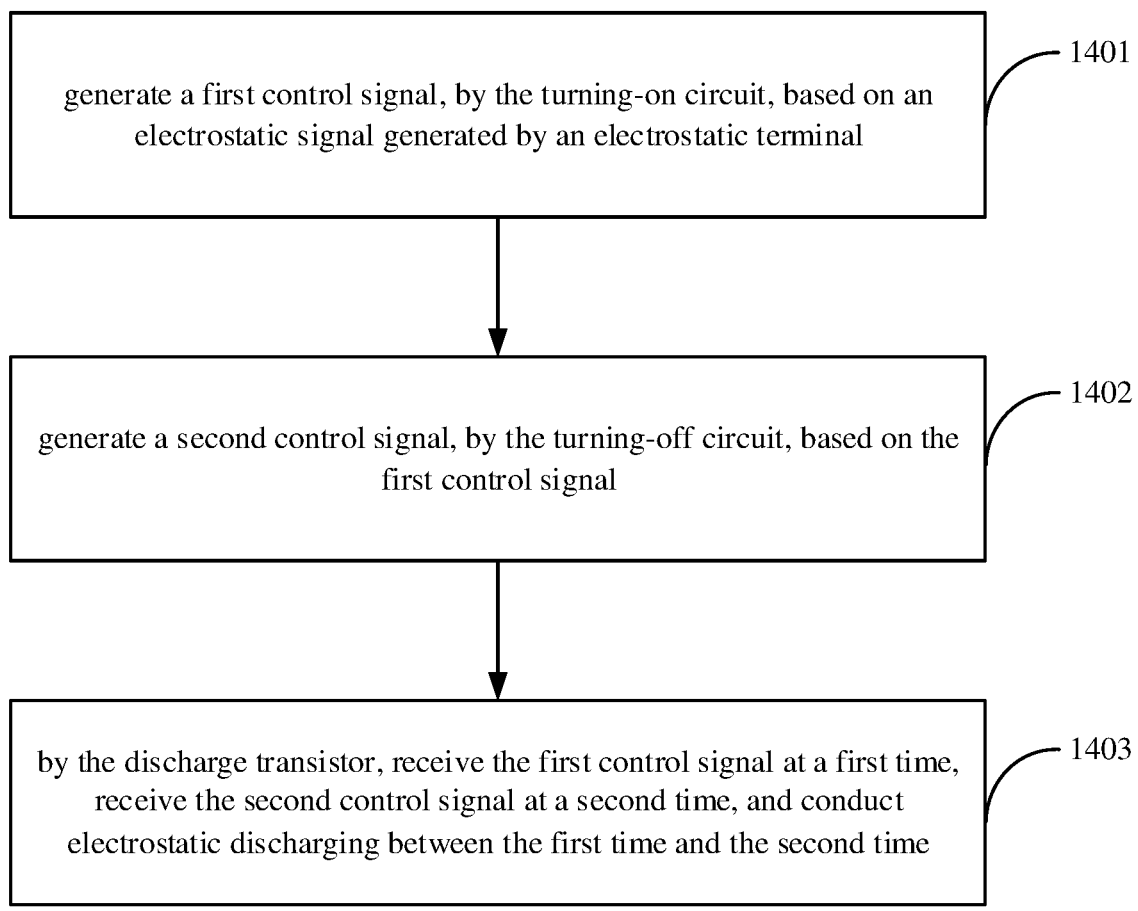
FIG. 14 is a schematic flowchart of a method of electrostatic protection provided by an implementation of the present disclosure.

FIG. 14 is a schematic flowchart of a method of electrostatic protection provided by an implementation of the present disclosure, the subject of the method of electrostatic protection may be an electrostatic protection circuit, FIG. 2 is a schematic diagram of the circuit structure of the electrostatic protection circuit. Referring to FIG. 2 and FIG. 14, the method of electrostatic protection includes the following operations: at 1401, the circuit may generate a first control signal, by the turning-on circuit 10, based on an electrostatic signal generated by an electrostatic terminal; at 1402, the circuit may generate a second control signal, by the turning-off circuit 20, based on the first control signal; at 1403, the circuit may, by the discharge transistor, receive the first control signal at a first time, receive, by the discharge transistor, the second control signal at a second time, and perform, by the discharge transistor, electrostatic discharging between the first time and the second time.

In some implementations, referring to FIG. 3, the turning-on circuit 10 includes a trigger circuit 101 and a first processing circuit 102, and the specific process of performing operation 1401 is as follows: generating a trigger signal, by the trigger circuit 101, based on the electrostatic signal; generating the first control signal, by the first processing circuit 102, based on the trigger signal.

In some implementations, referring to FIG. 3, the turning-off circuit 20 includes a coupling circuit 201 and a second processing circuit 202, and the specific process of performing operation 1402 is as follows: generating a first coupling signal and a second coupling signal, by the coupling circuit 201, based on the first control signal; the time interval between the second time and the first time is greater than or equal to the time interval between the first coupling signal and the second coupling signal; generating the second control signal, by the second processing circuit 202, based on the second coupling signal.

In the implementation of the present disclosure, the relevant content of the method of electrostatic protection described in operation 1401 to operation 1403 corresponds one-to-one with the electrostatic protection circuit in some of the foregoing implementations, and the technical effects achieved by the electrostatic protection circuits in some of the aforementioned implementations can also be achieved by this method of electrostatic protection, and will not be described in detail here.

The implementation of the present disclosure provides an electrostatic protection circuit with strong anti-interference ability and high reliability.

In an implementation of the present disclosure, the turning-on circuit generates a first control signal for controlling the turning-on of the discharge transistor based on the electrostatic signal generated by the electrostatic terminal, the time constant of the first resistor-capacitor circuit in the turning-on circuit is small (on the order of nanoseconds), which may increase the lower limit of the frequency of the electrostatic signal, prevent the electrostatic protection circuit from being falsely triggered due to low-frequency noise, thereby improving the anti-interference ability of the static protection circuit.

In an implementation of the present disclosure, the turning-on circuit is provided with an unidirectional conduction device, and the conduction voltage of the unidirectional conduction device D1 determines the lower limit of the electrostatic signal voltage, which prevents the electrostatic protection circuit from being falsely triggered due to low voltage noise, thereby improving the anti-interference ability of the electrostatic protection circuit.

In an implementation of the present disclosure, the turning-off circuit generates a second control signal for controlling the closing of the discharge transistor based on the first control signal generated by the turning-on circuit, the time constant of the second resistor-capacitor circuit in the turning-off circuit is large (on the order of microseconds), which enables the discharge transistor to complete electrostatic discharging upon or before the second control signal is generated, thereby ensuring sufficient electrostatic discharging and improving the reliability of the static electricity protection circuit.

In the implementation of the present disclosure, the turning-off circuit is provided with a second switching transistor, and only when the turning-on circuit generates the first control signal based on the electrostatic signal, the second switching transistor will be turned on, and when no electrostatic signal is generated, the turning-off circuit is in a masked state, thereby preventing the second resistor-capacitor circuit with a large time constant from being falsely triggered due to low-frequency noise at the electrostatic terminal, and improving the anti-interference ability of the electrostatic protection circuit.

The features disclosed in implementations of several apparatus provided in the present disclosure may be combined arbitrarily without conflicts to obtain implementations of new apparatus.

The features disclosed in several method implementations provided in the present disclosure may be combined arbitrarily without conflicts to obtain implementations of new methods.

The above is only specific implementations of the present disclosure, but the claimed scope of the present disclosure is not limited thereto, and changes or substitutions within the technical scope disclosed in the present disclosure that may be easily conceived by those skilled in the art shall fall within the claimed scope of the present disclosure. Therefore, the claimed scope of the present disclosure should be determined by the claimed scope of the claims.

What is claimed is:

1. A circuit for electrostatic protection, comprising:
 a turning-on circuit comprising a first resistor and a first capacitor, wherein the turning-on circuit is coupled to an electrostatic terminal and configured to generate a first control signal based on an electrostatic signal generated by the electrostatic terminal;
a turning-off circuit comprising a second resistor and a second capacitor, wherein the turning-off circuit is coupled to the turning-on circuit and configured to generate a second control signal based on the first control signal; and
a discharge transistor comprising a control terminal, a first terminal, and a second terminal,
wherein the control terminal of the discharge transistor is coupled to both the turning-on circuit and the turning-off circuit, the first terminal of the discharge transistor is coupled to a low voltage terminal, and a second terminal of the discharge transistor is coupled to the electrostatic terminal, and
wherein the discharge transistor is configured to:
receive the first control signal at a first time;
receive the second control signal at a second time; and
perform electrostatic discharging between the first time and the second time.

2. The circuit of claim 1, wherein the turning-on circuit comprises:
a trigger circuit coupled to the electrostatic terminal and configured to generate a trigger signal based on the electrostatic signal; and
a first processing circuit coupled to the trigger circuit and configured to generate the first control signal based on the trigger signal.

3. The circuit of claim 2, wherein the turning-off circuit comprises:
a coupling circuit coupled to the first processing circuit and configured to generate a first coupling signal and a second coupling signal based on the first control signal, a time interval between the second time and the first time being greater than or equal to the time interval between the first coupling signal and the second coupling signal; and
a second processing circuit to the coupling circuit and configured to generate the second control signal based on the second coupling signal.

4. The circuit of claim 3, wherein the trigger circuit comprises:
a first resistor-capacitor circuit that includes the first resistor and the first capacitor concatenated between the electrostatic terminal and the low voltage terminal,
wherein one terminal of the first resistor is coupled to the electrostatic terminal, and another terminal of the first resistor is coupled to the first capacitor,
wherein one terminal of the first capacitor is coupled to the first resistor, and another terminal of the first capacitor is coupled to the low voltage terminal, and
wherein the another terminal that couples the first resistor and the first capacitor with each other is an output terminal of the trigger circuit.

5. The circuit of claim 4, wherein the trigger circuit further comprises:
a unidirectional conduction device coupled between the first resistor and the first capacitor,
wherein the first resistor is coupled to an input terminal of the unidirectional conduction device,
wherein the first capacitor is coupled to the output terminal of the unidirectional conduction device, and
wherein the input terminal of the first resistor coupled to the unidirectional conduction device is also coupled to the output terminal of the trigger circuit.

6. The circuit of claim 4, wherein the first processing circuit comprises:
a first inverter comprising a first input terminal coupled to the output terminal of the trigger circuit;
a second inverter comprising a second input terminal coupled to the output terminal of the first inverter; and
a first switching transistor comprising:
a control terminal coupled to the output terminal of the second inverter;
a first terminal coupled to the electrostatic terminal; and
a second terminal coupled to the output terminal of the first processing circuit.

7. The circuit of claim 6, wherein the second terminal of the first switching transistor is further coupled to the input terminal of the second inverter.

8. The circuit of claim 6, wherein the coupling circuit comprises:
the second resistor, wherein the second resistor comprises one terminal coupled to the low voltage terminal;
a second switching transistor comprising a control terminal coupled to the output terminal of the first processing circuit, and a first terminal of the second switching transistor coupled to the other terminal of the second resistor, wherein the second switching transistor is turned on after receiving the first control signal; and
the second capacitor, wherein the second capacitor comprises one terminal coupled to the electrostatic terminal, and another terminal coupled to the second terminal of the second switching transistor,
wherein the terminal that couples the second resistor and the second switching transistor with each other is the output terminal of the coupling circuit, and
wherein the second resistor and the second capacitor form a second resistor-capacitor circuit after the second switching transistor is turned on.

9. The circuit of claim 8, wherein a time constant of the second resistor-capacitor circuit is equal to the time interval between the first coupling signal and the second coupling signal.

10. The circuit of claim 8, wherein the second processing circuit comprises:
a third inverter comprising the input terminal coupled to the output terminal of the coupling circuit;
a third switching transistor comprising:
a control terminal coupled to the output terminal of the third inverter;
a first terminal coupled to the low voltage terminal; and
a second terminal,
wherein the second terminal of the third switching transistor is the output terminal of the second processing circuit.

11. The circuit of claim 8, wherein a time constant of the second resistor-capacitor circuit is greater than a time constant of the first resistor-capacitor circuit.

12. A memory device, comprising:
a circuit for electrostatic protection, comprising:
a turning-on circuit comprising a first resistor and a first capacitor, wherein the turning-on circuit is coupled to an electrostatic terminal and configured to generate a first control signal based on an electrostatic signal generated by the electrostatic terminal;
a turning-off circuit comprising a second resistor and a second capacitor, wherein the turning-off circuit is coupled to the turning-on circuit and configured to generate a second control signal based on the first control signal; and a discharge transistor comprising a control terminal, a first terminal, and a second terminal,
wherein the control terminal of the discharge transistor is coupled to both the turning-on circuit and the turning-off circuit,
wherein the first terminal of the discharge transistor is coupled to a low voltage terminal, and a second terminal of the discharge transistor is coupled to the electrostatic terminal, and
wherein the discharge transistor is configured to:
receive the first control signal at a first time;
receive the second control signal at a second time; and
perform electrostatic discharging between the first time and the second time.

13. The memory device of claim 12, wherein:
the electrostatic terminal of the circuit for electrostatic protection is coupled to a power supply terminal of the memory device, and
the circuit for electrostatic protection is configured to discharge the electrostatic signal of the power supply terminal.

14. The memory device of claim 12, wherein:
the electrostatic terminal of the circuit for electrostatic protection is coupled to an input/output pad of the memory device, and
the circuit for electrostatic protection is configured to discharge the electrostatic signal of the input/output pad.

15. The memory device of claim 12, wherein the turning-on circuit comprises:
a trigger circuit coupled to the electrostatic terminal and configured to generate a trigger signal based on the electrostatic signal; and
a first processing circuit coupled to the trigger circuit and configured to generate the first control signal based on the trigger signal.

16. The memory device of claim 15, wherein the turning-off circuit comprises:
a coupling circuit coupled to the first processing circuit and configured to generate a first coupling signal and a second coupling signal based on the first control signal, a time interval between the second time and the first time being greater than or equal to the time interval between the first coupling signal and the second coupling signal; and
a second processing circuit to the coupling circuit and configured to generate the second control signal based on the second coupling signal.

17. The memory device of claim 16, wherein the trigger circuit comprises:

a first resistor-capacitor circuit that includes the first resistor and the first capacitor concatenated between the electrostatic terminal and the low voltage terminal,
wherein one terminal of the first resistor is coupled to the electrostatic terminal, and the other terminal of the first resistor is coupled to the first capacitor,
wherein one terminal of the first capacitor is coupled to the first resistor, and the other terminal of the first capacitor is coupled to the low voltage terminal, and
wherein the terminal that couples the first resistor and the first capacitor with each other is an output terminal of the trigger circuit.

18. A method of electrostatic protection, comprising:
generating a first control signal, by a turning-on circuit comprising a first resistor and a first capacitor, based on an electrostatic signal generated by an electrostatic terminal;
generating a second control signal, by a turning-off circuit comprising a second resistor and a second capacitor, based on the first control signal;
receiving, by a discharge transistor, the first control signal at a first time;
receiving, by the discharge transistor, the second control signal at a second time by the discharge transistor; and
performing, by the discharge transistor, electrostatic discharging between the first time and the second time.

19. The method of claim 18, wherein:
the turning-on circuit includes a trigger circuit and a first processing circuit, and
the generating the first control signal, by the turning-on circuit, based on the electrostatic signal generated by the electrostatic terminal comprises:
generating a trigger signal, by the trigger circuit, based on the electrostatic signal; and
generating the first control signal, by the first processing circuit, based on the trigger signal.

20. The method of claim 19, wherein:
the turning-off circuit includes a coupling circuit and a second processing circuit, and
the generating the second control signal, by the turning-off circuit, based on the first control signal comprises:
generating a first coupling signal and a second coupling signal, by the coupling circuit, based on the first control signal, a time interval between the second time and the first time being greater than or equal to the time interval between the first coupling signal and the second coupling signal; and
generating the second control signal, by the second processing circuit, based on the second coupling signal.

* * * * *